(12) United States Patent
Sanduleanu et al.

(10) Patent No.: US 7,501,871 B2
(45) Date of Patent: Mar. 10, 2009

(54) LATCH CIRCUIT

(75) Inventors: Mihai Adrian Tiberiu Sanduleanu, Eindhoven (NL); Eduard Ferdinand Stikvoort, Eindhoven (NL); Idrissa Cissé, L'Hay les Roses (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/588,579

(22) PCT Filed: Jan. 25, 2005

(86) PCT No.: PCT/IB2005/050286

§ 371 (c)(1),
(2), (4) Date: Feb. 1, 2008

(87) PCT Pub. No.: WO2005/076478

PCT Pub. Date: Aug. 18, 2005

(65) Prior Publication Data

US 2008/0136483 A1 Jun. 12, 2008

(30) Foreign Application Priority Data

Feb. 5, 2004 (EP) .................................. 04100427

(51) Int. Cl.
*H03K 3/00* (2006.01)

(52) U.S. Cl. ..................... 327/218; 327/199; 327/200; 327/201; 327/202; 327/203; 327/204; 327/205; 327/206; 327/207; 327/208; 327/209; 327/210; 327/211; 327/212

(58) Field of Classification Search ............... 327/115, 327/117, 218
See application file for complete search history.

(56) References Cited

U.S. PATENT DOCUMENTS

| 3,339,089 | A | | 8/1967 | Bergman | |
|---|---|---|---|---|---|
| 4,841,168 | A | * | 6/1989 | Kubota | ........................ 327/202 |
| 5,220,212 | A | * | 6/1993 | Sinh | ........................... 326/126 |
| 2003/0001646 | A1 | | 1/2003 | Hairapetian | |
| 2003/0193355 | A1 | * | 10/2003 | Leifso et al. | ................. 327/115 |

FOREIGN PATENT DOCUMENTS

EP 0 350 261 1/1990

* cited by examiner

*Primary Examiner*—Kenneth B Wells
*Assistant Examiner*—Daniel Rojas

(57) ABSTRACT

A latch circuit comprising, a differential input with a non-inverting input (D+) and an inverting input (D−). The latch further comprises a differential output with a non-inverting output (Q+) and an inverting output (Q−). One of the outputs (Q−) is coupled to one of the inputs input (D+) having an opposite polarity. The latch further comprises a control input for receiving a control signal ($V_{cM}$) for determining a threshold for an input signal (In) such that if the input signal is at larger than the threshold the non-inverting output is in a HIGH logic state and in a LOW state if the input signal is smaller than the threshold.

16 Claims, 5 Drawing Sheets

LATCH CIRCUIT

BACKGROUND OF THE INVENTION

The invention relates to a latch circuit, and more particularly to a latch circuit suitable for high-speed operation at low supply voltages.

Latch circuits are commonly used circuits, e.g., for memorizing a binary signal, for use in state machines, frequency dividers, counters. Modern technology trends are low-voltage supply for digital circuits for obtaining a relatively lower power consumption of logic families operating at lower and lower supply voltages and down-scaling of the oxide thickness for reliability reasons. When speed is an important feature, the design of digital building blocks may be inspired by analog techniques since any of the classical digital solutions working at low speed do not provide the required performance. The fastest logic family is MOS technology, which is widespread in modern integrated circuits, is the so-called Source Coupled Logic (SCL) family. However, at relatively low supply voltages, e.g., 1.2 V or lower, SCL family does not work properly due to the stacking of transistors, i.e., between a positive supply voltage and ground there are at least three transistors. This category includes AND, OR, XOR gates and the D-latch. The D-latch is relatively difficult function to be implemented because the requirements for a relatively small set-up and hold times are obtained with a relatively high power consumption. When working with signals having a period comparable with the time delay through the latch, the latch requires high gain to operate correctly. However, the transconductance of modern MOS transistors is lower than their bipolar counterparts and therefore larger transistors and higher currents are necessary. As a consequence, the rise and fall times of the digital signals are deteriorated and therefore the operating speed of the circuit is reduced.

U.S.-2003/0001646 describes, among other circuits, a latch circuit as shown in FIG. 6. FIG. 6 shows an SCL triggered D-latch. When CK is positive, the differential pair M1, M2 tracks the input D and on the negative level of the CK the latch M3, M4 becomes active memorizing in a binary format the input signal provided at the D input. This circuit has several disadvantages.

The supply voltage is limited to $V_{GS}+2(V_{GS}-V_T)+\Delta V$, where $V_{GS}$ is the gate-source voltage of one of the transistors M1 ... M4, or the MOS current source $I_0$, $V_T$ is the threshold voltage of the transistors and $\Delta V$ is the voltage drop on the resistor R needed to bias the transistors M1 and M2. In modern processes like CMOS18 the supply voltage is limited to 1.8 V and the circuit should work at 1.62 V (1.8 V-10%).

The latch and the differential pair share the same load together. Therefore the latch has the difficult task to take decisions on a large capacitance load given by its own stray capacitances the parasitic capacitances of M1 and M2 and the load capacitance given by wiring, fan-in and the resistor R. The use of a buffer between the latch and the gain stage is excluded due to the lack of voltage headroom and the lack of good source-followers in baseline digital processes.

The intrinsic delay between the data path and the clock path. The clock path has a larger delay than the data path and therefore the delay times from CK to Q output ($t_{dCK\rightarrow Q}$) and from D to Q output ($t_{dD\rightarrow Q}$) are not equal. This can impair the function of a phase detector and can generate extra offset in a PLL loop in lock.

The transistors are stacked. Thus the operating level of the $\Delta$ and CK signals are different. Level shifting between the D levels and the CK level, needs extra source followers or other level shifters that decrease the speed of operation and increase the delay between the data path and the clock path.

Hence, there is a need to obtain a latch operating at relatively high frequency and using relatively low supply voltages.

SUMMARY

The invention is defined by the independent claims 1 and 10. The dependent claims define advantageous embodiments. It is provided a latch circuit comprising,
- a differential input with an inverting input and a non-inverting input,
- a differential output with an inverting output and a non-inverting output,
- one of said non-inverting outputs being coupled to one of said input, having opposite polarity; and
- a control input for receiving a control signal for determining a threshold for an input signal such that if the signal is at larger than the threshold the non-inverting is in a HIGH logic state and in a LOW state if the signal is smaller than the threshold, respectively.

Logical states of a logic circuit as a latch are determined inter alia by the supply voltage. It is defined a threshold level, which may be a current or a voltage, and a signal having a higher amplitude that the threshold level determines a logical 1 signal and a logical 0, otherwise. For a given family of logic circuits, the threshold level depends on the supply voltage. In order to adapt to a relatively large set of supply voltages i.e. between 3 V and 9 V, a control signal, which determines the threshold level is provided. Furthermore, the latch circuit is adapted to receive single ended signals and provides differential output signals.

It is also provided a latch circuit adapted for differential input signals and comprising a first latch portion and second latch portion, which are substantially identical, each latch portion comprising
- a differential input with an inverting input and a non-inverting input,
- a differential output with an inverting output and a non-inverting output,
- one of the outputs of the first latch portion being coupled to one of the inputs of the second latch portion, having opposite polarity,
- one of the outputs of the second latch portion being coupled to one of the inputs of the first latch portion having opposite polarity,
- a differential input signal being provided at one of the inputs of the first latch portion and to one of the inputs of the second latch portion having opposite polarity, respectively, and
- each of the latch portions comprising a control input, coupled to a respective control signal, which determines a threshold for the input signal such that if the input signal is larger than the threshold the output latch is in a HIGH logic state and in a LOW state if the signal is smaller than the threshold, respectively. In the differential implementation, it is possible to identify a track circuit, which is the first latch portion and a latch, which is the second latch portion. A threshold of the first latch portion and second latch portion is determined by the control signals. Hence a relatively good adaptation to supply voltage is realized. Another advantage of the differential implementation is that it uses identical parts as single ended implementation and therefore the cost of implementation is relatively low and the design process is reduced when compared with the known implementations.

The embodiments refer to implementations in CMOS technology but the inventive concept may be applied mutatis mutandis to other technologies, e.g., GaAs, SiGe.

BRIEF DESCRIPTION OF THE DRAWINGS

The above and other features and advantages of the invention will be apparent from the following description of the exemplary embodiments of the invention with reference to the accompanying drawings, in which.

DETAILED DESCRIPTION

Figure 1:
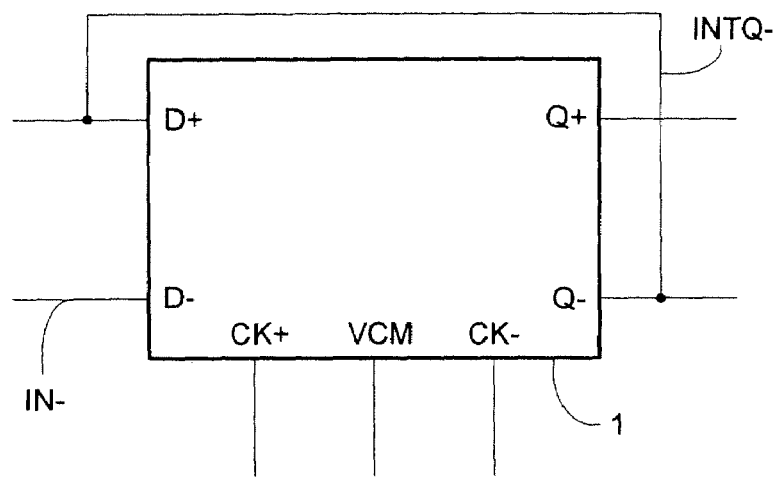
FIG. 1 depicts a block diagram of a latch circuit adapted to single ended input signals, according to an embodiment of the invention.

FIG. 1 depicts a block diagram of a latch circuit adapted to single ended input signals, according to the invention. The circuit comprises a differential input with a non-inverting input D+ and an inverting input D−. It is also provided a differential output with a non-inverting output Q+ and an inverting output Q− and a differential clock input with a non-inverting clock input Ck+ and an inverting clock input Ck−.

The inverting output Q− is coupled to the inverting input D+ and the non-inverting input D− is provided for receiving a single ended inverting input signal IN−, which is memorized in the latch. The latch further has a control input for receiving a control signal $V_{CM}$ for determining a threshold for the input signal IN− such that if the signal is at level above the threshold, the output latch is in a HIGH logic state and in a LOW state otherwise. Logical states of a logic circuit are dependent on the supply voltage. Logical states are defined by a threshold level, which may be a current or a voltage, and a signal having an higher amplitude than the threshold level are defined as a logical 1 signal and a logical 0, otherwise. For a given family of logic circuits, the threshold level generally depends on the supply voltage. In order to adapt to a relatively large range of supply voltage, i.e., between 3 V and 0.9 V, a control signal, which determines the threshold level is provided. Furthermore, the latch circuit can be adapted to receive single ended signals and provides differential output signals.

Figure 2:
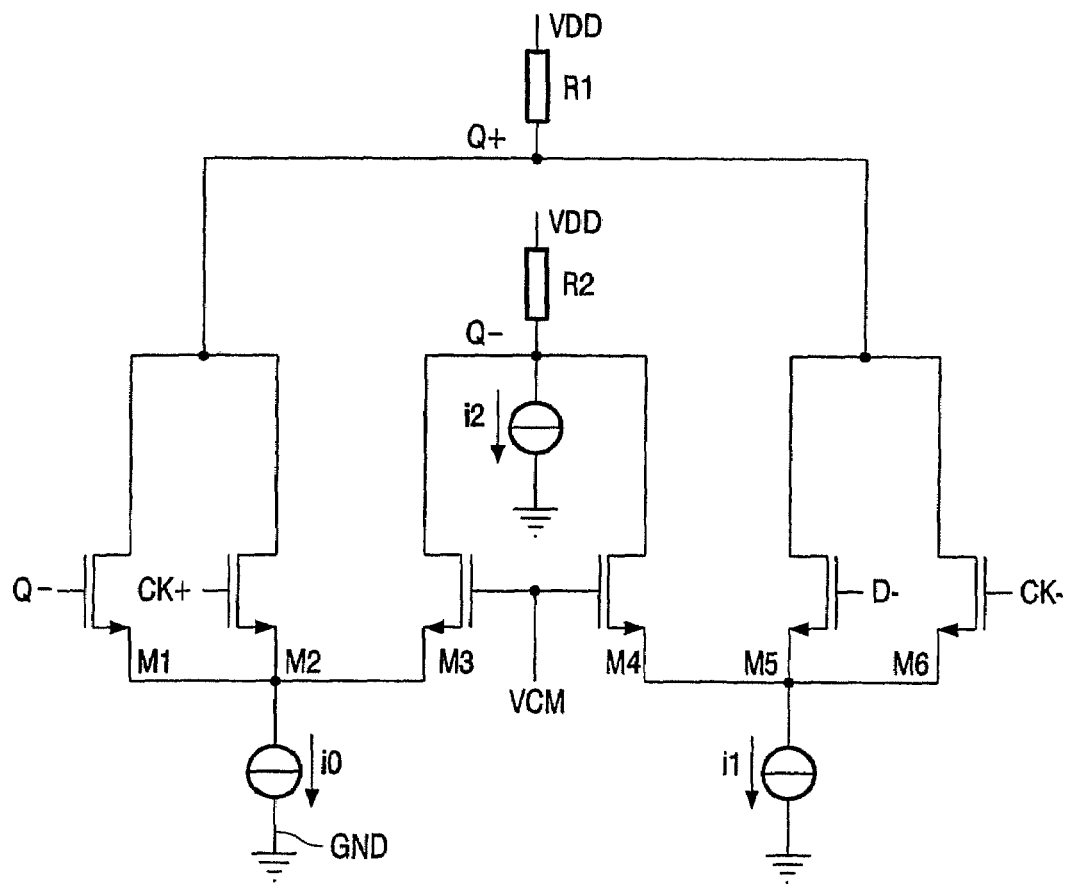
FIG. 2 depicts a transistor-level implementation of the latch circuit adapted to single ended input signals, according to an embodiment of the invention.
Figure 5:
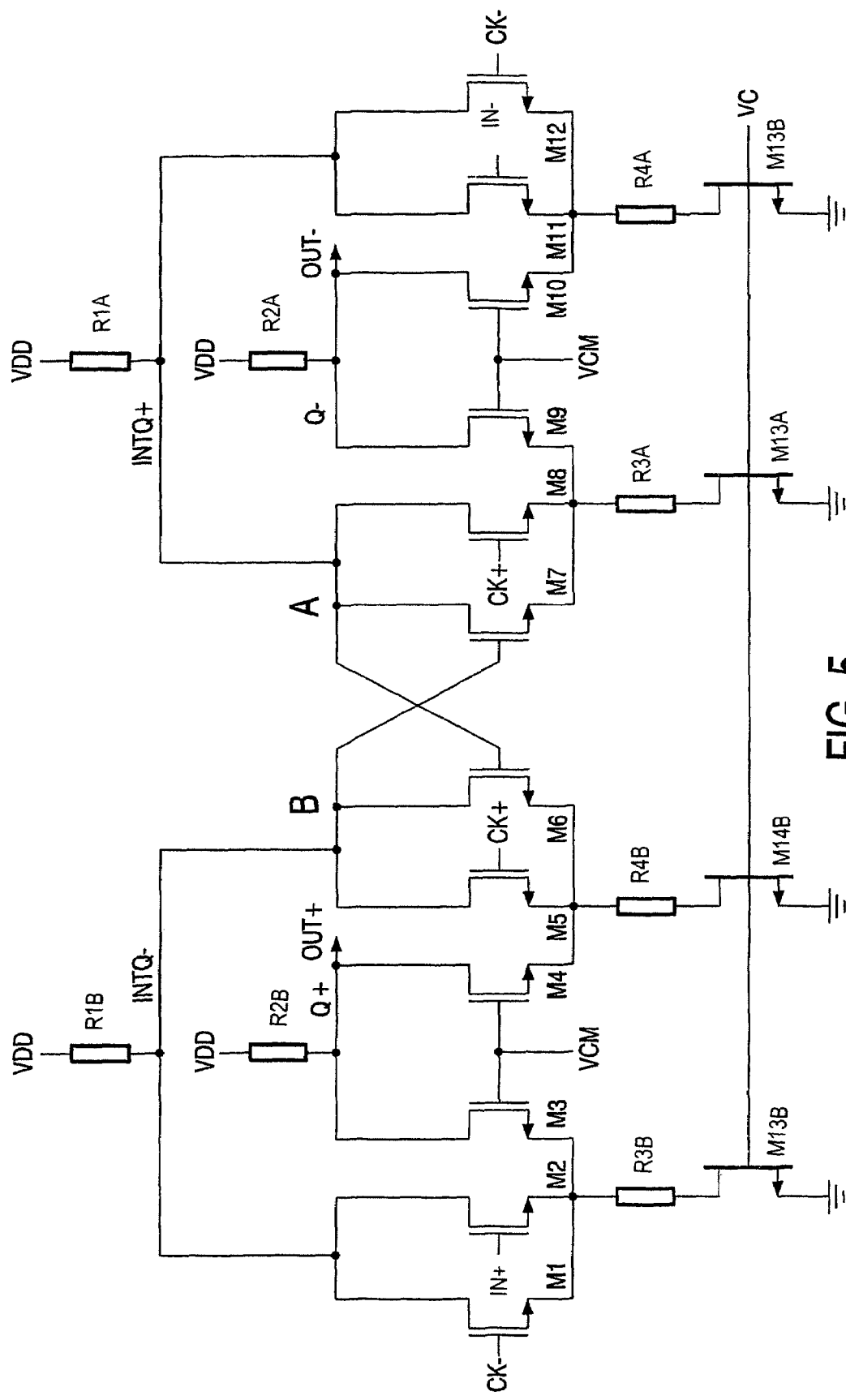
FIG. 5 depicts a transistor level implementation of a second embodiment of a latch circuit adapted to differential input signals, according to an embodiment of the invention.
Figure 6:
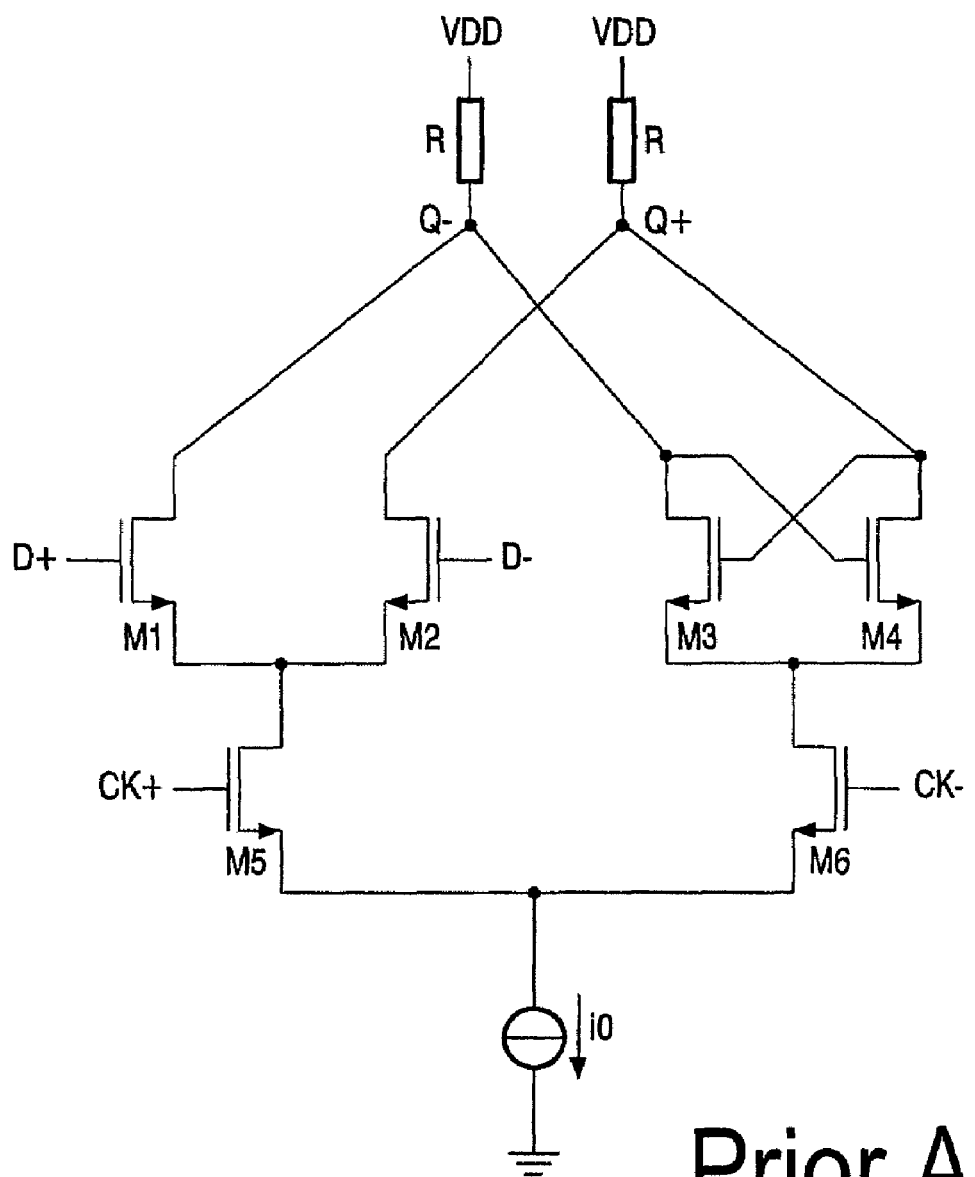
FIG. 6 depicts a prior-art latch circuit.

The latch circuit of FIG. 1 is further described with reference to FIG. 2 depicting a transistor-level implementation of the latch circuit adapted to single ended input signals. The circuit comprises a first pair of transistors, with a first transistor M1 and a second transistor M3 having their sources coupled to each other and a second pair of transistors comprising a third transistor M4 and a fourth transistor M5 having their sources coupled to each other. A gate of the second transistor M3 is coupled to a gate of the third transistor M4 and to the control signal VCM. The inverting output Q− is connected to a gate of the first transistor M1. The circuit further includes a pair of switches comprising a first switch M2 and a second switch M6 having their respective drains and sources coupled to the respective drains an sources of the first transistor M1 and the fourth transistor M5, respectively. Gate of the first switch M2 is driven by the non-inverting clock signal Ck+ and gate of the second switch(M5) is driven by the inverting clock signal Ck−. In the latch circuit shown in FIG. 2 the sources of the first transistor M1 and the second transistor M3 are supplied by a first current source I0 and the sources of the third transistor M4 and the fourth transistor M5 are supplied by a second current source I1. In a preferred embodiment, the first current source (I0) and the second current source I1 provide substantially equal currents and therefore the transistors M1, M2, M3 and M4, M5, M6 share the same current. In the latch circuit the drain of the first transistor M1 and the drain of the fourth transistor M5 are coupled to each other and further coupled to a supply voltage VDD via a first resistor R1. The drain of the second transistor M3 is coupled to a drain of the third transistor M4, the drains being further coupled to the supply voltage VDD via a second resistor R2. The first resistor and the second resistor may have substantially identical values. The second resistor R2 is coupled to a reference terminal GND via a third current source I2. It should be observed that the current sources might be implemented in various ways, e.g., simply resistors, but to increase the overall performance of the latch over a range of temperature the first current source I0 and the second each have a transistor operating as current source in series with a resistor, as shown in FIG. 5. A voltage VC controls the sources. When temperature changes, the resistance of the series resistor changes, the source currents in the latch stages are adjusted accordingly in order to ensure a correct operation over a large temperature range.

Referring to FIG. 2, in a tracking-mode, the non-inverting clock CK+ is HIGH, the inverting clock Ck− is LOW and the transistors M4 and M5 set as a differential pair sharing the current Iφ whereas M6 is in cut-off, i.e., a negligible current passes through it. The signal received at the inverting input D− is amplified at the non-inverting output Q+ and inverting output Q−. Accordingly, the transistor M2 gets the whole current Iφ forcing the transistors M1 and M3 to cut off. The amplitude of the clock CK+ is sufficiently high to substantially avoid any leakage current from M1 and M3. The voltage VCM provides a threshold for the input data in tracking mode and for the latch in a latching mode.

In the attaching mode, the inverting clock CK− is asserted LOW, the non-inverted clock Ck+ is asserted HIGH and the transistor M6 takes the whole current I1. As a consequence, the transistors M4 and M5 are in cut-off. The transistor M2 is also in cut-off and the transistors M1 and M3 are active and the data is transferred from the input to the output and it is memorized. This is a relatively fast circuit since the amplifying loop is a source follower M1 and a cascade transistor M3, having a relatively large bandwidth.

Table 1 shows the switching table of the latch with the analog values presented at the two outputs. The current source at the output I2 has the role of generating a differential operation with a swing of $RI_0$, where $I_0=I1=I0$.

TABLE 1

| D+ | CK+ | Q + [n] | Q + [n + 1] | Q − [n + 1] |
|---|---|---|---|---|
| 0 | 0 | 0 | $V_{DD}$-2$RI_0$ | $V_{DD}$-$RI_0$ |
| 0 | 0 | 1 | $V_{DD}$-$RI_0$ | $V_{DD}$-2$RI_0$ |

TABLE 1-continued

| D+ | CK+ | Q+[n] | Q+[n+1] | Q−[n+1] |
|---|---|---|---|---|
| 0 | 1 | 0 | $V_{DD}$-2$RI_0$ | $V_{DD}$-$RI_0$ |
| 0 | 1 | 1 | $V_{DD}$-2$RI_0$ | $V_{DD}$-$RI_0$ |
| 1 | 0 | 0 | $V_{DD}$-2$RI_0$ | $V_{DD}$-$RI_0$ |
| 1 | 0 | 1 | $V_{DD}$-$RI_0$ | $V_{DD}$-2$RI_0$ |
| 1 | 1 | 0 | $V_{DD}$-$RI_0$ | $V_{DD}$-2$RI_0$ |
| 1 | 1 | 1 | $V_{DD}$-$RI_0$ | $V_{DD}$-2$RI_0$ |

In table 1 it was considered that all current sources deliver the same current I0. Furthermore, all resistors have the same resistance R.

Since the input is not a differential input we can extend the basic circuit to a differential input, differential output circuit with some extra advantages compared to the simple basic idea. An embodiment of the invention with differential input and differential output is shown in FIGS. 3 and 4.

Figure 3:
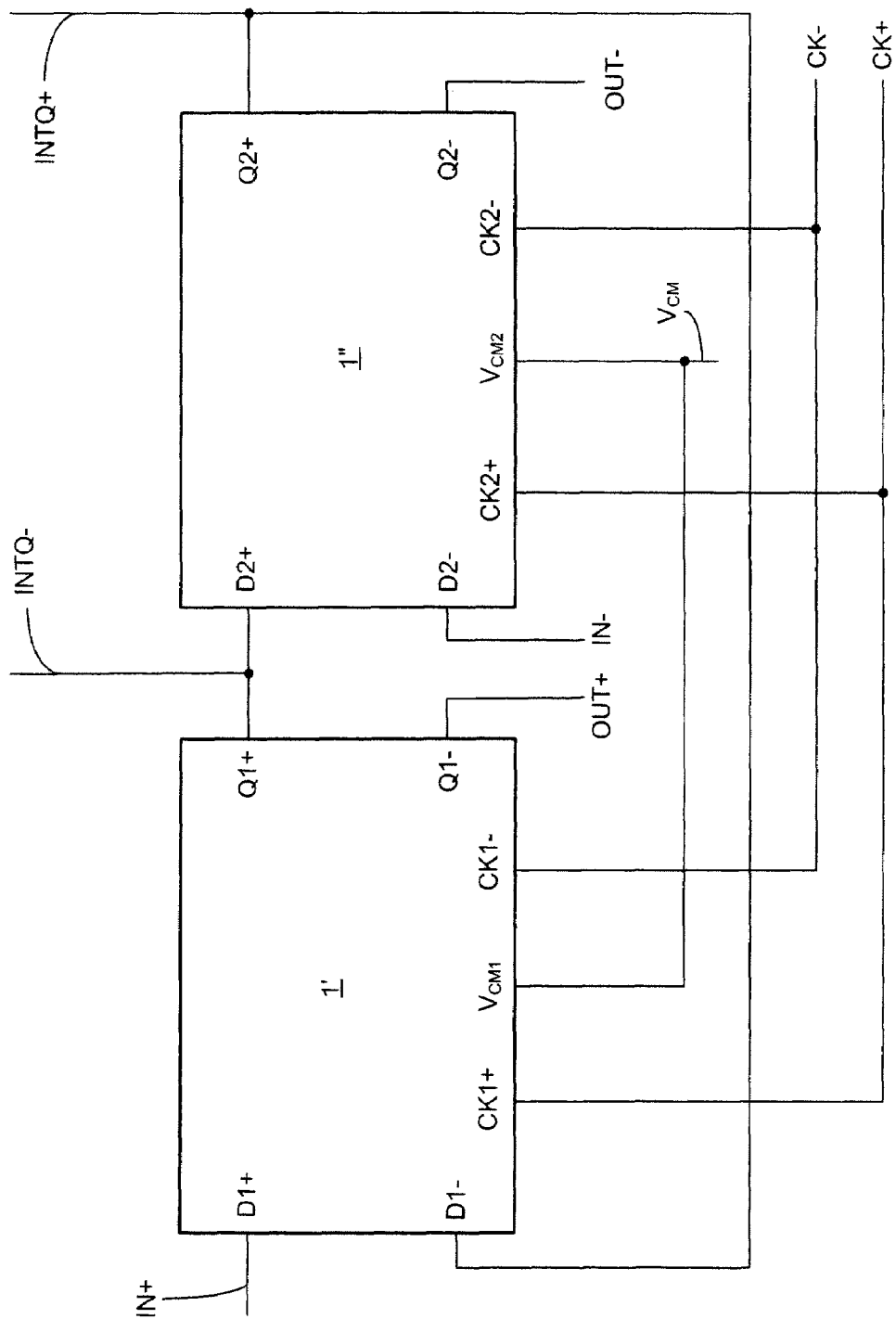
FIG. 3 depicts a block diagram of a latch circuit adapted to differential input signals, according to an embodiment of the invention.

FIG. 3 depicts a block diagram of a latch circuit adapted to differential input signals. The latch circuit is adapted for differential input signals In+, In− and comprises a first latch portion 1' and second latch portion 1", which are substantially identical. Each latch portion comprises a differential input with a non-inverting input D1+, D2+ and an inverting input D1−, D2−, a differential output with a non-inverting output Q1+, Q2+ and an inverting output Q1−, Q2− and a differential clock input with a non-inverting clock input CK1+, Ck2+ and an inverting clock input Ck1−, Ck2−. The non-inverting clock inputs are coupled to each other and are further coupled to a non-inverting clock signal Ck+ and the inverting clock inputs being coupled to each other and being further coupled to an inverting clock signal Ck−. The inverting output Q1− of the first latch portion 1' is coupled to the non-inverting input (D2+) of the second latch portion (1"). The non-inverting output Q2+ of the second latch portion being coupled to the inverting input of the first latch portion D1−. A differential input signal In+, In− is provided at the inverting input of the first latch portion 1' and to the inverting input of the second latch portion 1", respectively, and each of the latch portions has a control input $V_{CM1}$, $V_{CM2}$, which is coupled a respective control signal $V_{CM1}$, $V_{CM2}$, which determines a threshold for the input signal In+, In− such that if the signal is larger than the threshold the signal is in a HIGH logic state and in a LOW state, otherwise. In the differential implementation, it is possible to identify a track circuit, which is the first latch portion 1' and a latch, which is the second latch portion 1". A threshold of the first latch portion 1' and second latch portion 1" is determined by the control signals $V_{CM1}$, $V_{CM2}$. Hence, a relatively good adaptation to supply voltage VDD to the threshold voltages of the latch circuit is realized. Another advantage of the differential implementation is that it uses identical parts as single ended implementation and therefore the cost of implementation is relatively low and the design process is reduced.

Figure 4:
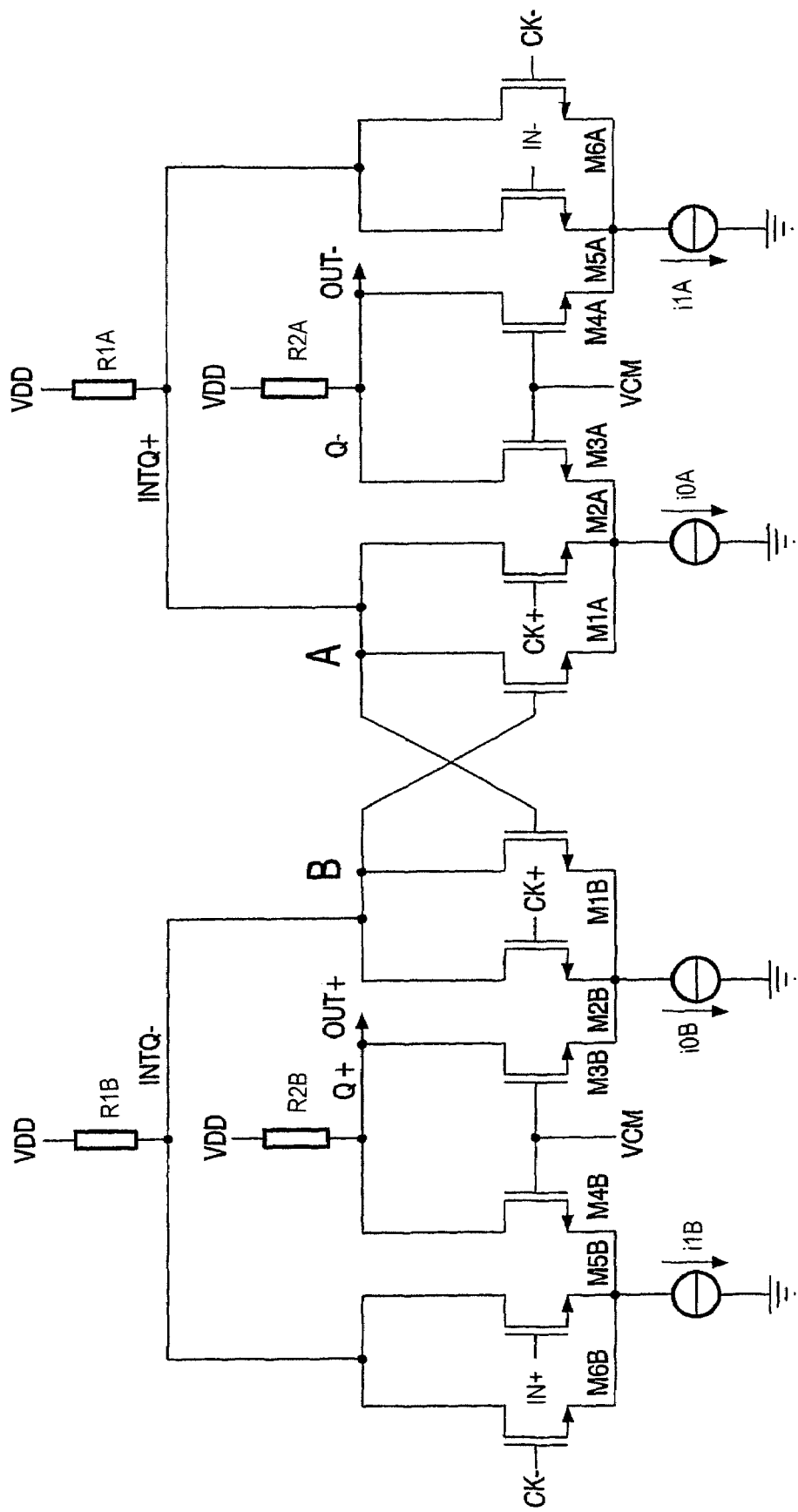
FIG. 4 depicts a transistor implementation level of a first embodiment of a latch circuit adapted to differential input signals, according to an embodiment of the invention.

FIG. 4 depicts a transistor level schematic of a latch circuit adapted to differential input signals. The latch circuit comprises transistors, each transistor having a source, a gate and a drain, and wherein each latch portion 1'; 1" comprises a first pair of transistors comprising a first transistor M1A; M1B and a second transistor M3A; M3B, having their sources coupled to each other, respectively. The latch circuit further comprises a second pair of transistors comprising a third transistor M4A; M4B and a fourth transistor M5A; M5B, having their sources coupled to each other, respectively. A gate of the second transistor M3A; M3B is coupled to a gate of the third transistor M4A; M4B respectively and further coupled to a DC voltage level VCM. In this particular implementation, the control signals $V_{CM1}$, $V_{CM2}$ are equal to each other and further equal to $V_{CM}$. A pair of switches comprising a first switch M2A; M2B and a second switch M6A; M6B, the switches including transistors having their respective drains and sources coupled to the respective drains an sources of the first transistor M1A; M1B and the fourth transistor M5A; M5B, respectively, is also provided. The gate of the first switch M2A; M2B is driven by a binary clock signal Ck+ and gate of the second switch M6A; M6B being driven by an inverted binary clock signal Ck−. The two latch portions 1', 1" are crossed-coupled such that a gate of the first transistor M1A; M1B of a portion is coupled to the respective output of the other portion INTQ−; INTQ+, respectively.

The sources of the first transistor M1A, M1B and the second transistor M3A, M3B are supplied by a first current source I0A, I0B. The sources of the third transistor M4A, M4B and the fourth transistor M5A, M5B are supplied by a second current source I1A, I1B. Particularly, the current sources deliver substantially equal currents.

The drain of the first transistor M1A; M1B and the drain of the foruth transistor M5A; M5B are coupled to each other respectively and further coupled to a supply voltage VDD via a resistor R1A, R1B. The drain of the second transistor M3A; M3B is coupled to a drain of the third transistor M4A; M4B, respectively, the drains being further coupled to the supply voltage VDD via a second resistor R2A, R2B.

In the tracking-mode, the non-inverting clock CK+ is HIGH asserted, and consequently the inverting clock Ck− is LOW asserted, and the D+, D− input voltages are amplified at the internal nodes INTQ− and INTQ+ and Q+, Q− respectively. Since M2A and M2B are conducting, the latch is in cut-off and no latching action is possible. In the latching mode, the inverting clock CK− is HIGH asserted, and consequently the non-inverting clock CK+ is LOW asserted. The transistors M2A and M2B are cut-off now. The information from the D+, D− inputs is not passed at the outputs. The transistors M6A and M6B are active now and the information present at the internal nodes A and B is latched. Regarding FIG. 4, it is observed that data has two paths: a path to the output via the common-source, common-gate configurations M5A, M5B and M4A, M4B respectively and a path to the internal node INTQ+ and INTQ− via common source transistors M5A and M5B. Hence, the latch and the gain stages may be optimized separately using different loads for the latch R1 and the output R2. Moreover, when the latch is taking decisions at the outputs A and B the transistors M6A and M6B are active and the information present at the nodes A and B is amplified at the outputs Q+, Q− with a high speed provided by stages M1A, M3A and M1B, M3B. This reduces setup and hold times.

FIG. 5 depicts a transistor level schematic of a second embodiment of a latch circuit adapted to differential input signals. The first current source I0 and the second current source I1 comprises a series connection of a main current channel of a controlled current source M13A, M14A, M13B, M14B and resistors R3A, R4A, R3B, R4B. A voltage VC controls the controlled sources M13A, M14A, M13B, M14B. It should be observed that the current sources might be implemented in various ways as, e.g., simply resistors, but to increase the overall performance of the latch versus temperature the first current source I0 and the second current source I1 comprise a series connection as described above. When temperature changes, the resistance of the resistors R3A, R4A, R3B, R4B changes and therefore the source currents in the latch stages are adjusted accordingly in order to ensure a correct operation over a large temperature range.

It is remarked that the cope of protection of the invention is not restricted to the embodiments described herein. Neither is the scope of protection of the invention restricted by the reference numerals in the claims. The word 'comprising' does not exclude other parts than those mentioned in the claims. The word 'a (n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A latch circuit receiving an inverting input signal, a non-inverting clock signal, an inverting clock signal, and a common mode control signal; and producing a non-inverting output signal and an inverting output signal, the latch circuit comprising;
a first transistor having its drain coupled to the non-inverting output signal and its gate coupled to the inverting output signal;
a second transistor having its drain coupled to the non-inverting output signal, its gate coupled to the non-inverting clock signal, and its source coupled to the source of the first transistor;
a third transistor having its gate coupled to the common mode control signal, and its source coupled to the source of the first transistor;
a fourth transistor having its drain coupled to the drain of the third transistor, and its gate coupled to the common mode control signal;
a fifth transistor having its drain coupled to the non-inverting output signal, its gate coupled to the inverting input signal, and its source coupled to the source of the fourth transistor; and
a sixth transistor having its drain coupled to the non-inverting output signal, its gate coupled to the inverting clock signal and its source coupled to the source of the fourth transistor.

2. The latch as claimed in claim 1, wherein
the sources of the first transistor, the second transistor, and the third transistor are coupled to a first current source; and
the sources of the fourth transistor, the fifth transistor, and the sixth transistor are coupled to a second current source.

3. The latch circuit as claimed in claim 2, wherein the first current source and the second current source provide substantially equal currents.

4. The latch circuit as claimed in claim 2, wherein the non-inverting output is coupled to a supply voltage via a first resistor.

5. The latch circuit as claimed in claim 1, wherein the inverting output is coupled to the supply voltage via a second resistor.

6. The latch circuit as claimed in claim 5, wherein the second resistor is coupled to a third current source.

7. The latch circuit as claimed in claim 2, wherein the first current source and the second current source comprises a series connection of a main current channel of a controlled current source and a resistor.

8. The latch circuit as claimed in claim 7, wherein the controlled current source is controlled by a voltage.

9. A latch circuit adapted for differential input signals, comprising:
a first latch portion and a second latch portion, each latch portion comprising:
a differential input with an inverting input and a non-inverting input;
a differential output with an inverting output and a non-inverting output; and
a control input which determines a threshold for the input signals such that when the input signal is a larger than the threshold the output latch is in a HIGH logic state and in a LOW state when the signal is smaller than the threshold, wherein
one of the outputs of the first latch portion is coupled to the inputs of the second latch portion having opposite polarity;
one of the outputs of the second latch portion is coupled to one of the inputs of the first latch portion having opposite polarity; and
a differential input signal to the latch circuit is coupled to one of the inputs of the first latch portion and to the input of the second latch portion having an opposite polarity.

10. The latch circuit as claimed in claim 9 wherein each latch portion further comprises:
a first transistor having its drain coupled to the non-inverting output of the latch portion and its gate coupled to the non-inverting input of the latch portion;
a second transistor having its drain coupled to the non-inverting output signal of the latch portion, its gate coupled to a non-inverting clock signal, and its source coupled to the source of the first transistor;
a third transistor having its gate coupled to the control input and its source coupled to the source of the first transistor;
a fourth transistor having its drain coupled to the drain of the third transistor and its gate coupled to the control input;
a fifth transistor having its drain coupled to the non-inverting output of the latch portion, its gate coupled to the inverting input of the latch portion, and its source coupled to the source of the fourth transistor; and
a sixth transistor having its drain coupled to the non-inverting output of the latch portion, its gate coupled to an inverting clock signal, and its sources coupled to the source of the fourth transistor.

11. The latch as claimed in claim 10 wherein
the sources of the first transistor; the second transistor, and the third transistor are coupled to a first current source; and
the sources of the fourth transistor, the fifth transistor, and the sixth transistor are coupled to a second current source.

12. The latch circuit as claimed in claim 11, wherein the first current source and the second current source provide substantially equal currents.

13. The latch circuit as claimed in claim 10, wherein each latch portion further comprises a first resistor coupling the inverting output of the latch portion to a supply voltage.

14. The latch circuit as claimed in claim 13, wherein each latch portion further comprises a second resistor coupling the non inverting output of the latch portion to the supply voltage.

15. The latch circuit as claimed in claim 11, wherein the first current source and the second current source comprise a series connection of a main current channel of a controlled current source and a resistor.

16. The latch circuit as claimed in claim 15, wherein the controlled current source is controlled by a voltage.

* * * * *